United States Patent [19]

Schnelle

[11] 3,958,586
[45] May 25, 1976

[54] COMBINED WASHER AND DRYER UNIT

[75] Inventor: Charles Wayne Schnelle, Aurora, Mo.

[73] Assignee: Tasope' Limited, Aurora, Mo.

[22] Filed: Dec. 4, 1974

[21] Appl. No.: 529,404

[52] U.S. Cl. .................................. 134/68; 134/127
[51] Int. Cl.² ............................................. B08B 3/02
[58] Field of Search .................. 134/67, 68, 72–73, 134/127, 151

[56] References Cited
UNITED STATES PATENTS

| | | | |
|---|---|---|---|
| 1,765,996 | 6/1930 | Olson | 134/68 X |
| 1,936,279 | 11/1933 | Webb | 134/68 |
| 2,011,107 | 8/1935 | Lape, Jr. | 134/72 UX |
| 2,219,007 | 10/1940 | Dostal | 134/73 |
| 3,483,877 | 12/1969 | Naslund | 134/127 |

*Primary Examiner*—Robert L. Bleutge
*Attorney, Agent, or Firm*—Cohn, Powell & Hind

[57] ABSTRACT

This washer and dryer unit includes tandem washer and dryer housings having separate but coacting transversely inclined belt conveyor assemblies adapted to deliver printing plates successively through the washer housing and dryer housing without manual handling. The washer belt conveyor assembly extends outwardly of the washer housing at each end through sealed openings to provide a portion at one end for receiving the workpiece, and a portion at the other end for transferring the workpiece into the dryer housing. The dryer belt conveyor assembly extends outwardly of the housing at one end only through a sealed opening to deliver the workpiece from the dryer housing to a collection station. The conveyor assemblies are provided with a common drive. The washer housing is provided with a laterally inclined spray system therein directed at the washer conveyor belt. The dryer housing is provided with a laterally inclined ultraviolet lamp assembly directed at the dryer conveyor belt, and also an air blower directing hot air across the belt.

4 Claims, 10 Drawing Figures

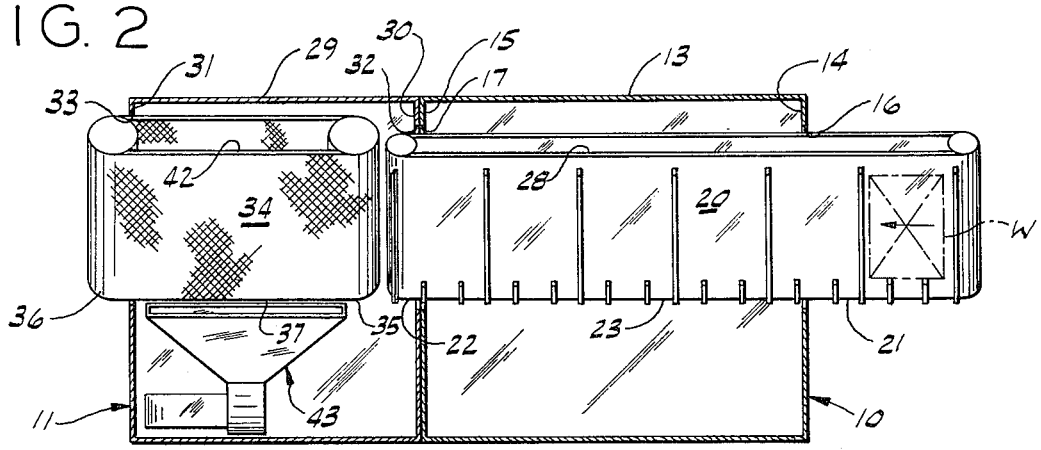
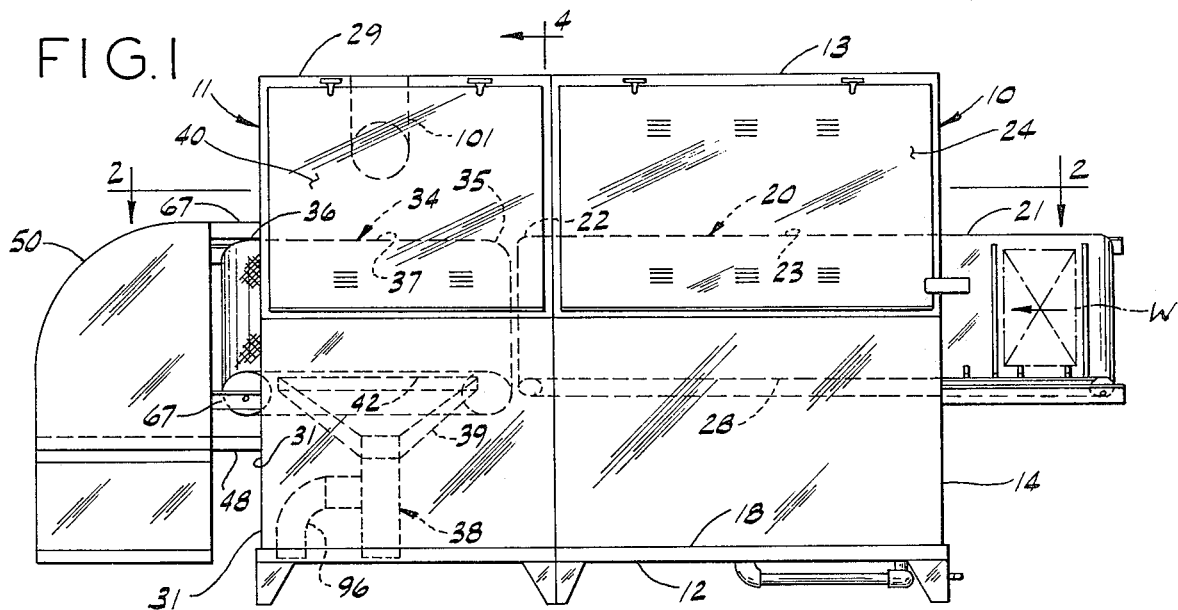
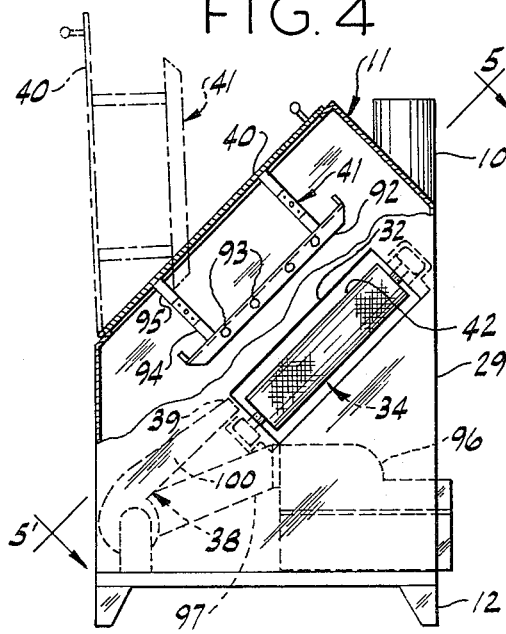
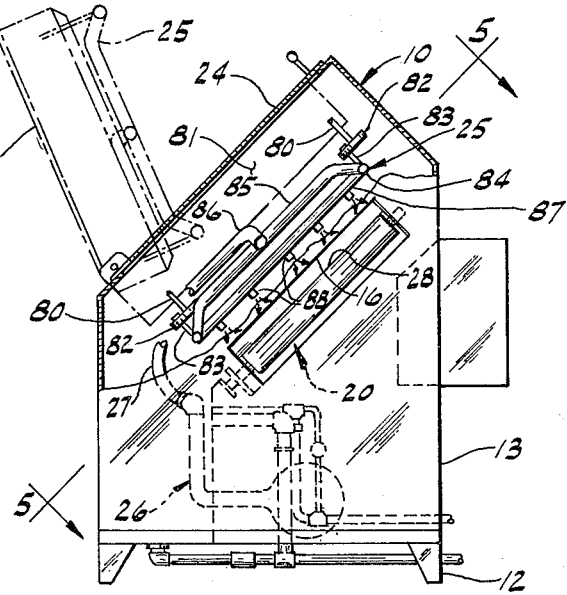

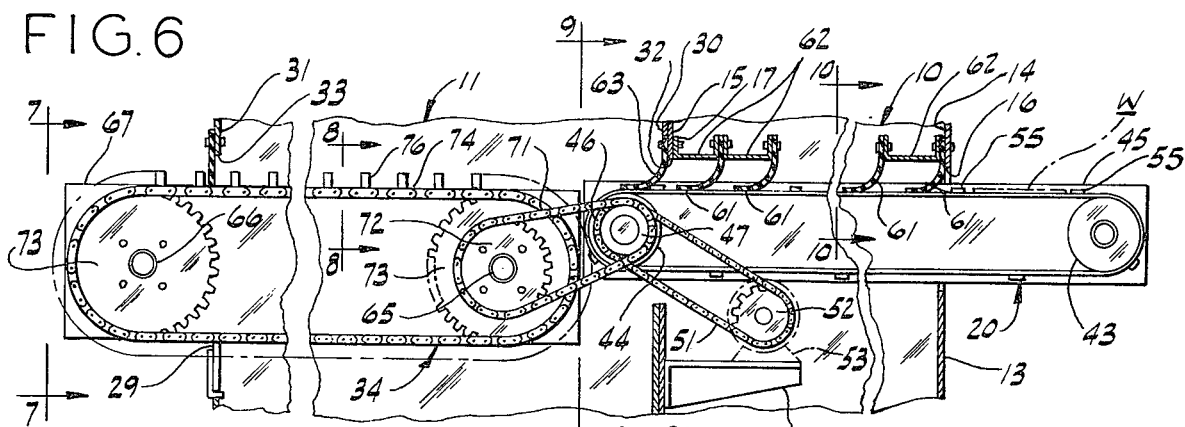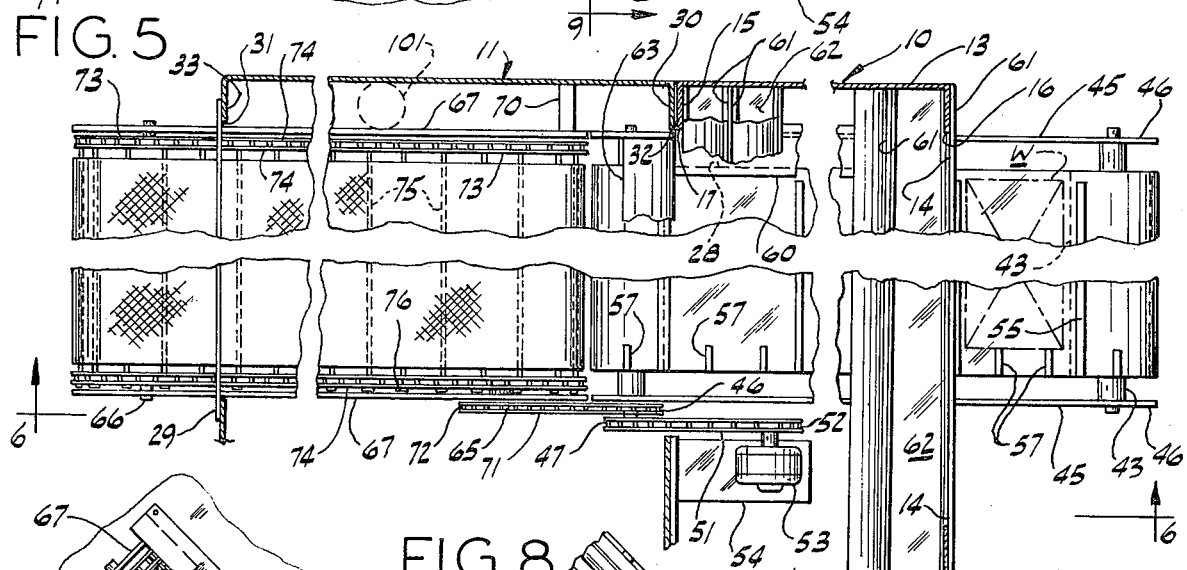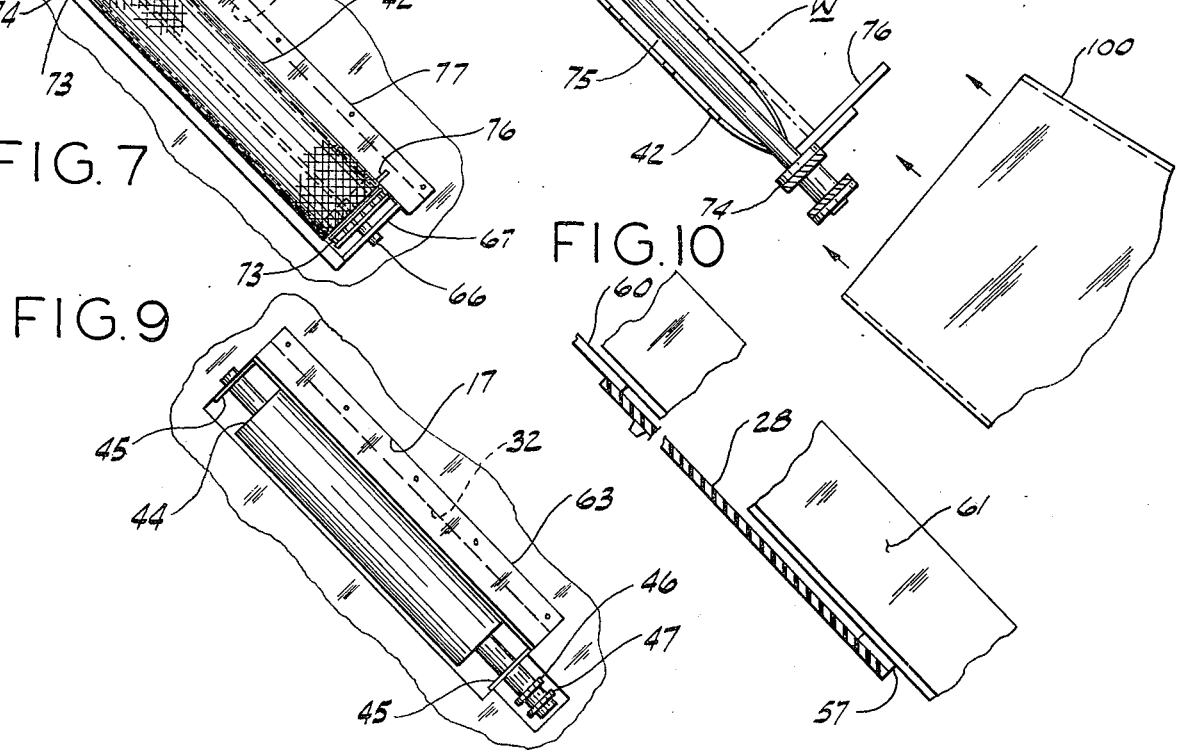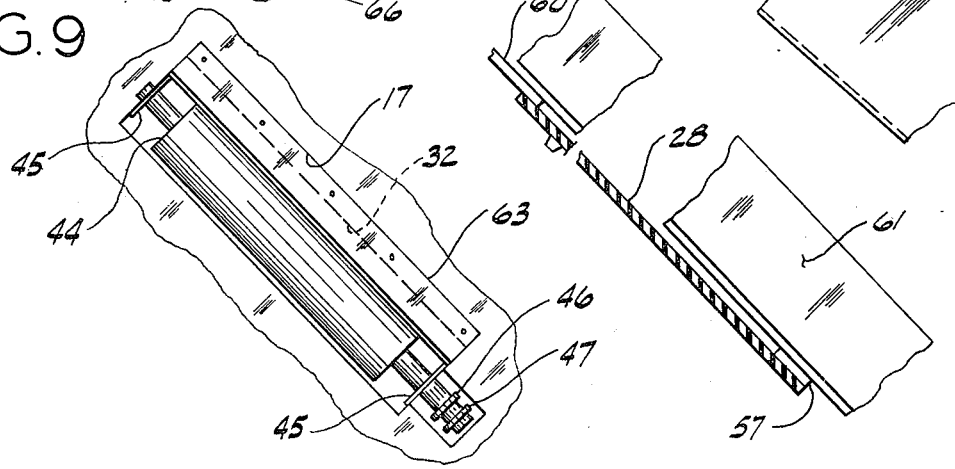

COMBINED WASHER AND DRYER UNIT

BACKGROUND OF THE INVENTION

This invention relates generally to washer and dryer units for printing plates, and particularly to a combination unit having a belt conveyor system providing continuous movement through structurally independent washer and dryer units.

Although a continuous wash and dry operation is very desirable in the processing of printing plates, the practical problems of separating the successive operations while maintaining continuous motion of the workpiece have not been solved in prior devices. One problem lies in the effective, uninterrupted transfer of the workpiece from the washing stage to the drying stage without handling the workpiece. Another problem lies in the difficulty encountered in removing excess standing water, received by the workpiece in the washing station, prior to entry into the drying station. In addition, the problem of providing a combination unit which can be broken down into relatively small component segments adapted for easy transportation, and yet which are simply installed in a combined housing, has not been adequately solved.

The present combination unit solves these problems in a manner neither disclosed nor suggested in the known prior art.

SUMMARY OF THE INVENTION

This combination washer and dryer unit provides separate washer and dryer housings, and yet permits continuous motion of the workpiece from one housing to the other without manual handling by utilizing separate conveyor assemblies, one of which extends between the housings. The washer unit conveyor assembly is inclined to reduce excess standing water on the workpiece to a minimum, and the washer housing is sealed to substantially preclude the egress of water therefrom. The separate units can be manufactured inexpensively and shipped as complete, independent units which can be rapidly installed simply and efficiently into a single combined unit at the point of use.

It is an important object of this invention to provide separate but adjacent washer and dryer housings having longitudinally aligned belt conveyor assemblies adapted for transference of a workpiece from one to the other.

Another object is to provide the belt conveyor assembly of the washer unit with an outwardly extending portion received within the adjacent end of the dryer unit.

It is an object to provide both of the belt conveyor assemblies with a laterally inclined conveyor belt to facilitate run-off in the washer unit and air drying in the dryer unit.

Another object is to provide a washer unit having openings for the belt conveyor assembly which are substantially sealed to preclude the egress of water, the seals lengthwise lapping the belt upper face in the direction of travel.

Yet another object is to form the washer unit conveyor belt of an imperforate material, and to form the dryer unit belt from a perforate material.

An object is to provide the washer unit with an inclined bank of sprays moving in a parallel plane disposed above the movable belt and directing the wash liquid onto the belt, and to provide the upper edge of said belt with a lengthwise extending seal.

Still another object is to provide the dryer unit with an inclined bank of ultraviolet lamps directing radiation onto the conveyor, and a air blower having a nozzle directing hot air substantially across the upper part of the conveyor belt.

Another object is to provide both conveyors with a common drive means.

BRIEF DESCRIPTION OF THE DRAWINGS

FIG. 1 is a front elevational view of the combination washer and dryer in somewhat schematic form;

FIG. 2 is a sectional plan view taken on line 2-2 of FIG. 1 with the collector and conveyor assembly side supports omitted for clarity;

FIG. 3 is an end view of the washer unit with the housing end wall partially removed;

FIG. 4 is an end view of the dryer unit taken on line 3—3 of FIG. 1 with the housing end wall partially removed;

FIG. 5 is an enlarged fragmentary plan view of the washer and dryer conveyor assemblies taken on a plane corresponding to lines 5—5 and 5'—5' of FIGS. 3 and 4;

FIG. 6 is a fragmentary sectional elevational view taken on line 6—6 of FIG. 5;

FIG. 7 is a fragmentary sectional view taken on line 7—7 of FIG. 6;

FIG. 8 is an enlarged fragmentary sectional view taken on line 8—8 of FIG. 6;

FIG. 9 is a fragmentary sectional view taken on line 9—9 of FIG. 6; and

FIG. 10 is an enlarged fragmentary sectional view taken on line 10—10 of FIG. 6.

DESCRIPTION OF THE PREFERRED EMBODIMENT

Referring now by characters of reference to the drawings and first to FIGS. 1 and 2, it will be understood that the combination washer and dryer includes a washer unit 10 and a dryer unit 11, and that said units are disposed in end-to-end relation and are seated upon a common base 12. Each of the units 10 and 11 includes a belt conveyor assembly, indicated respectively by numerals 20 and 34, which together provide a means of transporting a workpiece W through the washer and dryer combination. The combination unit is particularly adapted to process photosensitive plastic printing plates, which must be first thoroughly washed free of etchant material, and then dried and cured to complete polymerization. For simplicity, the details of the sealing and mounting of the belt conveyor assemblies are omitted in FIGS. 1 and 2, which are somewhat schematic in form, and will be described below with reference to FIGS. 5 and 6.

As shown in FIG. 2, the washer unit 10 includes a housing 13 having opposed end walls 14 and 15 having openings 16 and 17 respectively. The inclined belt conveyor assembly 20 which is housed within the washer housing 13 is inclined at an angle of about 45° in the preferred embodiment, and includes opposed end portions 21 and 22 extending outwardly of the housing through the openings 16 and 17 respectively, and an intermediate portion 23 which extends between said end portions 21 and 22.

As shown in FIG. 3, the washer housing 13 is provided with a lid 24 having a spray grid assembly 25 eccentrically mounted thereto, said spray grid assembly being connected to a water supply assembly 26 by means of a flexible hose 27. The spray grid assembly 25 provides a moving spray plane substantially parallel to the inclined belt conveyor assembly 20 to direct water onto the upper surface of an imperforate continuous belt 28.

The dryer unit 11 includes a housing 29 having opposed end walls 30 and 31 providing openings 32 and 33 respectively. The belt conveyor assembly 34, which is housed within the dryer housing 29, is inclined at substantially the same angle as the washer unit belt conveyor assembly 20, and includes opposed end portion 35 terminating inwardly of the housing 29; end portion 36 extending outwardly of said housing through the opening 33 and an intermediate portion 37 extending between said end portions 35 and 36. Importantly, the opening 32 in the dryer housing end wall 30 receives the washer conveyor end portion 22 therethrough. This structural arrangement of parts provides that a workpiece W deposited on the right hand conveyor end portion 21 can be passed through the washer and dryer combination and delivered into a collector device 50 provided at the left hand conveyor end portion 36. It will be understood that the belt conveyor assemblies 20 and 34 are aligned to provide upper belt surfaces in substantially the same plane, and that the dryer unit conveyor end portion 35 is sufficiently close to washer unit conveyor end portion 22 so that the workpiece W can readily be transferred from one belt assembly to the other.

As shown in FIG. 4, the dryer housing 29 includes a lid 40 having an ultraviolet lamp assembly 41 attached thereto in substantially parallel relation to the inclined dryer belt conveyor assembly 34 to direct radiation onto the upper surface of a perforate continuous belt 42. In addition to the ultraviolet lamp assembly 41, the drying of the workpiece W is expedited by means of a blower assembly, generally indicated by numeral 38, which includes a blower 39 directed to supply heated air across the upper portion of said belt 42.

The structural arrangement of the various components of the device, as shown in FIGS. 5–10, will now be described more specifically.

The washer belt conveyor assembly 20 includes a pair of end rolls 43 and 44 carried in journal relation between a pair of opposed, longitudinally disposed side support arms 45 mounted to end walls 14 and 15. End roll 44 provides a drive roll and includes a pair of sprockets 46 and 47 at the lower outer end. Sprocket 46 is connected by means of a chain 51 to a drive sprocket 52 attached to the shaft of a drive motor 53, which is mounted to the washer housing 13 as by a support bracket 54. The washer conveyor belt 28, in the preferred embodiment, is of an imperforate, elastomeric material and includes transverse strips 55 which separate the belt surface into sections, each receiving a standard size of workpiece printing plate W. Intermediate, relatively short stop strips 57 are provided which act to retain the workpiece W on the belt 28. The upper edge of the belt 28 is overlapped by a sealing element 60 carried by the longitudinal support 45, which has the effect of precluding the entry of water to the underside of the belt 28.

The washer unit end wall openings 16 and 17 are sealed to preclude the escape of water from the washer housing 13. In the case of opening 16, the seal is provided by a pair of sealing strips 61 attached above the upper margin of the opening 16 by means of a transverse support channel 62. In the free condition, the strips hang substantially vertically; however, as clearly shown in FIG. 6, when the washer belt conveyor assembly 20 is installed and operating, the sealing strips 61 provide flaps overlapping the belt 28 to preclude the escape of water from the opening 16, a dead zone being effectively provided between the strips 61. Similar sealing strips 61 are provided for opening 17, in this case a pair of channels 62 being provided for the two strips 61 and, in addition, an exterior strip 63 being provided which acts as a wiper seal and removes excess water from the surface of the belt 28. All of the transverse strips 61 and 63 are attached to their associated channels 62 and housing end walls 14 and 15 as by fasteners.

The dryer unit belt conveyor assembly 34, as will be readily understood from FIG. 6, includes a pair of end shafts 65 and 66 carried in journal relation between a pair of longitudinally disposed side support arms 67. In the vicinity of dryer housing end wall opening 33, the side supports 67 are carried by the dryer housing end wall 31. At the other end, said side supports 67 are carried by brackets, such as that indicated typically by numeral 70, attached to the dryer housing 29. As clearly shown in FIG. 6, the drive for the dryer belt conveyor assembly 34 is provided by a chain take-off from the washer belt conveyor assembly 20. The chain, indicated by numeral 71 extends between sprocket 46 of the washer conveyor roller 44 adjacent the dryer conveyor shaft 65 and a sprocket 72 which is provided at the outer end of the shaft 65.

The dryer conveyor shafts 65 and 66 each include a pair of spaced end sprockets 73 interconnected by opposed longitudinally extending chains 74. The two chains 74 are connected at spaced intervals along their length by transverse rods 75 which, in the embodiment shown, extend between and connect every eighth link, and provide a mounting means for the perforate belt 42. This belt 42 is of a double thickness, open mesh material as illustrated in FIGS. 7 and 8. At the lower, longitudinal edge of the belt 42, stops 76 are provided, connected to every other link, which act to retain the workpiece W on said mesh belt 42. A flapper element 77 of elastomeric or similar plastic material is provided to seal the dryer unit end wall opening 33 above the mesh belt 42.

The washer unit spray grid assembly 25 is best shown in FIG. 3. It will be understood that this assembly is suspended from four shafts 80 depending from each of four corners of a drive compartment generally indicated by numeral 81. The shafts 80 are connected to a drive means (not shown) within the drive compartment 81, and each includes an eccentric connection 82 at its lower end for mounting an associated pivot shaft 83, said shafts 83 being collectively fixedly attached to the spray grid assembly 25. These eccentric connections cause shafts 83 to orbit about the rotational axes of the shafts 80 to provide a moving spray plane. The spray grid assembly 25 is formed from a generally H-configuration of piping which includes a pair of opposed header arms 84 interconnected by a transverse water supply pipe 85. The supply pipe 85 includes an offset portion 86 which is connected to the water supply assembly 26 by means of the flexible hose 27. The headers 84 are interconnected by a plurality of transverse secondary pipes 87 to each of which is attached a plurality of spray nozzles 88.

The drying and curing system of the dryer unit 11, which is best shown in FIG. 4, consists of two component parts in the preferred embodiment. One of these parts is the ultraviolet lamp assembly 41, which effectuates curing by ultraviolet radiation and the other is the blower assembly 38 which effectuates drying by hot air. The ultraviolet lamp assembly 41 includes a rectangular panel 92 mounting a plurality of ultraviolet lamps 93. The panel 92 is provided with two pairs of spaced brackets 94 attached in telescopically adjustable relation to associated brackets 95 depending from the dryer lid 40. The lamps 93 are positioned so that the radiation is directed onto the workpieces W as said workpieces are moved through the dryer housing 29 by the conveyor belt 42. The blower assembly 38 includes a heater 96 connected by ductwork 97 to the blower 39. The blower 39 provides an elongate nozzle 100 having an orifice extending along a substantial portion of the length of the upper face of the mesh conveyor belt 42. Importantly, as clearly shown in FIGS. 4 and 8, the nozzle 100 directs a stream of heated air which flows across both the front and back of the workpiece W. Heated air tends to rise, and in the preferred embodiment the angle of the blower nozzle 100 is slightly less than the angle of inclination of the belt 42, and air is directed up both sides of the workpiece W through the mesh of the belt 42. Moisture saturated air is evacuated through a vent 101 located in the top of the dryer housing above the belt 42 at the far side of said belt.

It is thought that the functional advantages and structural features of this combined washer and dryer have become fully apparent from the foregoing description of parts but for completeness of disclosure, the installation and operation of the device will be briefly described.

As shown particularly in FIG. 1, the base 12 is provided with guide rails 18 which facilitate alignment of the washer and dryer units 10 and 11. The washer unit 10 is installed first, and the dryer unit 11 is installed by pushing it along the rails 18 until the adjacent washer and dryer housing end walls 15 and 30 respectively are engaged. When the adjacent end walls 15 and 30 of the washer and dryer units 10 and 11 respectively, are engaged, the projecting left hand end portion 22 of the washer belt conveyor assembly 20 is received within the opening 32 of the dryer housing end wall 30. The washer and dryer units 10 and 11 are then connected together as by fasteners (not shown), and collector 50 installed at the left hand end of the dryer unit 11 by attachment to the outstanding portion of the conveyor supports 67, and to an outstanding bracket 48 connected to the dryer end wall 31.

After installation, as clearly shown by FIGS. 1 and 2, the left hand end portion 22 of the washer belt conveyor assembly 20 projecting into the dryer housing is closely adjacent to the right hand end portion 35 of the dryer belt conveyor assembly 34. The receiving end portion 21 of the washer belt conveyor assembly 20 and the discharge end 36 of the dryer belt conveyor assembly 34 project outwardly of their respective housings. Thus, a workpiece W deposited on the right hand end portion 21 of the belt conveyor 20 is passed from one end to the other of the combined unit under continuous movement. As shown in FIG. 6 the upper surfaces of the conveyor belts 26 and 42 are in substantially the same plane. The diameter of the dryer conveyor sprockets 73 is substantially greater than the diameter of the washer conveyor rollers 43 and 44 to provide the comparatively large curvature which is desirable to facilitate movement of the double thickness mesh belt 42 around the sprockets 73. The drive for the dryer belt conveyor assembly 34 is provided by a chain 71 connected between the dryer conveyor sprocket 72 on the shaft 65 and the washer conveyor sprocket 46 on the adjacent washer conveyor roller 44. The sprockets 46 and 72 are sized so that the speeds of the upper surface of the belts 42 and 28 are substantially the same and together with the chain 71 constitute a drive connection means.

It will be understood that when the spray grid assembly 25 is operating, a moving bank of spray nozzles, disposed in a plane spaced in parallel relation from the conveyor belt 28, is directed onto said belt. Water is precluded from escaping from the openings 16 and 17 at opposite ends of the washer housing 13 by transverse seals 61 provided interiorly of the housing adjacent each opening. The seals 61 are flexible and are raised slightly by the transverse strips 55 as they pass through the openings 16 and into the washer unit 10. A workpiece W which is retained upon the inclined face of the belt 28 by intermediate stops 57, passes into the washer housing 13 via sealed opening 16, and is subjected to a moving spray from the spray grid assembly 25 as it passes through said housing before exiting from the washer housing via sealed opening 17. As the workpiece W passes into the dryer unit housing 29 via the end opening 32 in the dryer unit end wall 30, the wiper seal 63 removes excess water from the workpiece. Because of the substantial alignment between the conveyor belts 28 and 42 and the relatively close proximity of said belts, the workpiece W is transferred readily from one belt to the other. While progressing through the dryer housing the workpiece W, which is retained on the mesh belt 42 by stops 76, is subjected to perpendicularly directed radiant energy from the ultraviolet lamp assembly 41 which facilitates curing and drying of the workpiece W, and to a stream of hot air blown across the upper part of the belt 42 by the relatively narrow, lengthwise elongated orifice of the blower nozzle 100 to flow over both sides of the workpiece W which facilitates drying of said workpiece. The workpiece W then passes out of the dryer housing by way of the opening 33 which is provided with a flapper 77 to substantially facilitate evacuation of moisture laden air from the vent 101 rather than the opening 33.

After passing through the dryer housing 29, the workpiece W is deposited by the belt 42 into the collector 50 in a substantially dry and cured condition, the collector being adapted to retain and stack workpieces until collected.

I claim as my invention:

1. In a combination washer and dryer unit for printing plate workpieces:
   a. a first housing having opposed ends each including an opening,
   b. a second housing, having opposed ends each including an opening, said second housing being disposed in adjacent end-to-end relation with said first housing,
   c. a first belt conveyor assembly mounted to said first housing and including a continuous movable belt extending outwardly of one of the openings of said first housing and through the opening of the adjacent end of said second housing and into the interior of the second housing, d. a second belt conveyor assembly mounted to said second housing and including a continuous, movable belt terminating inwardly of said opening of said adjacent end of said second housing, e. spray means mounted within one of said housings for washing a workpiece on the conveyor belt thereof, f. drying means mounted within the other of said housings for drying a workpiece on the conveyor belt thereof, and g. drive means for driving the conveyor belts in the same direction, said conveyor belts being substantially longitudinally aligned in the same plane and sufficiently close so that the workpiece can be transferred from one belt to the other after passing into the second housing.

2. A washer and dryer unit as defined in claim 1, in which:

h. the first housing includes the spray means, i. the continuous belts of the first and second conveyor assemblies are inclined in a direction transverst to the direction of motion, and j. sealing means are provided for the conveyor belt within said first housing including flexible sealing elements disposed transversely of the direction of motion and substantially covering each end opening above the belt and overlapping said belt, said sealing means substantially precluding egress of liquid from said first housing openings, the sealing means including at least one elongate sealing element disposed above the belt within the first housing and providing an overlapping portion engaging the upper edge of said belt and extending generally in the direction of motion substantially between the transverse sealing elements for precluding entry of water to the underside of the belt.

3. A washer and dryer unit as defined in claim 1, in which:

h. the first and second conveyor belts are inclined in a direction transverse to the direction of motion, i. the spray means is mounted in the first housing and the first conveyor belt is substantially imperforate to facilitate liquid run-off in the first housing, and j. the dryer means is mounted in the second housing and the second conveyor belt is perforate to facilitate air flow therethrough in the second housing.

4. In a combination washer and dryer unit for printing plate workpieces:

a. a washer housing having opposed ends, one of said ends including an entrance opening, and the other of said ends including an exit opening, b. a belt conveyor assembly mounted to the washer housing and including a continuous belt having an upper face travelling from said entrance opening toward said exit opening, said upper face being inclined in a direction transverse to the direction of motion, c. spray means within the washer housing directing liquid onto a workpiece disposed on the upper surface of the conveyor belt, d. a dryer housing disposed in adjacent end-to-end relation with said washer housing and having opposed ends, one of said ends including an entrance opening adjacent the exit opening of the washer housing and the other of said ends including an exit opening, e. a belt conveyor assembly mounted to the dryer housing and including a continuous belt having one end disposed completely within the dryer housing and adjacent the continuous belt of the washer conveyor assembly, within the dryer housing to receive the workpiece from the washer conveyor assembly, said belt having an upper face travelling toward said exit opening of the dryer housing said upper face being inclined in a direction transverse to the direction of motion, f. drying means within the dryer housing, g. the continuous belt of the belt conveyor assembly mounted to the washer housing extending between and projecting outwardly of both said washer housing entrance and exit openings and projecting through the entrance opening of the dryer housing and into the dryer housing.

* * * * *